United States Patent
Sakamoto

(10) Patent No.: US 9,432,059 B1
(45) Date of Patent: Aug. 30, 2016

(54) TURBO EQUALIZER AND WIRELESS RECEIVING APPARATUS

(71) Applicant: Panasonic Corporation, Osaka (JP)

(72) Inventor: Takenori Sakamoto, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/958,559

(22) Filed: Dec. 3, 2015

(30) Foreign Application Priority Data

Mar. 23, 2015 (JP) .................... 2015-059459

(51) Int. Cl.
| | |
|---|---|
| H03M 13/00 | (2006.01) |
| H04L 25/08 | (2006.01) |
| H04B 1/12 | (2006.01) |
| H03M 13/29 | (2006.01) |
| H04L 25/02 | (2006.01) |
| H04L 25/03 | (2006.01) |
| H04L 1/00 | (2006.01) |

(52) U.S. Cl.
CPC ..... *H03M 13/6331* (2013.01); *H03M 13/2975* (2013.01); *H04B 1/123* (2013.01); *H04L 25/0256* (2013.01); *H04L 1/0048* (2013.01); *H04L 25/03006* (2013.01); *H04L 25/03019* (2013.01); *H04L 25/03292* (2013.01); *H04L 25/03318* (2013.01)

(58) Field of Classification Search
CPC ............. H04L 1/0048; H04L 25/0256; H04L 25/03006; H04L 25/03019; H04L 25/03292; H04L 25/03318; H03M 13/2957; H03M 13/6331; H03M 13/2975; H04B 1/123
See application file for complete search history.

(56) References Cited

U.S. PATENT DOCUMENTS

| | | | | |
|---|---|---|---|---|
| 7,609,754 | B2 * | 10/2009 | Fulghum ............... | H04B 1/712 375/148 |
| 2006/0018367 | A1 | 1/2006 | Bui | |
| 2011/0004803 | A1 * | 1/2011 | Yokomakura ......... | H03M 13/29 714/752 |
| 2011/0007839 | A1 * | 1/2011 | Tang ..................... | H03F 1/32 375/296 |
| 2011/0188561 | A1 * | 8/2011 | Mizrahi ................ | H04B 1/1027 375/227 |
| 2011/0249779 | A1 * | 10/2011 | Miao ..................... | H04B 7/0848 375/347 |
| 2012/0051416 | A1 * | 3/2012 | Wang .................... | H04L 25/08 375/232 |
| 2012/0195399 | A1 * | 8/2012 | Zhu ....................... | H04L 1/0046 375/341 |

FOREIGN PATENT DOCUMENTS

| | | | | |
|---|---|---|---|---|
| JP | 2006-054900 | | 2/2006 | |
| KR | 10-2010-0020657 | * | 2/2010 | ............. H04B 7/005 |

OTHER PUBLICATIONS

EPO Espacenet English Machine translation of Abstract and Description for KR 20100020657, 12 pages.*

* cited by examiner

*Primary Examiner* — Chieh M Fan
*Assistant Examiner* — Michelle M Koeth
(74) *Attorney, Agent, or Firm* — Seed Intellectual Property Law Group PLLC

(57) ABSTRACT

A first noise variance estimator calculates a first noise variance estimation value based on an channel estimation value of a received signal. A minimum mean squared error (MMSE) filter performs equalization on a residual interference component that is obtained by subtracting an interference component and desired signal component from the received signal. A second noise variance estimator calculates a second noise variance estimation value by using the equalized residual interference component that is output from the MMSE filter. A first noise variance selector and second noise variance selector select either one of the first or second noise variance estimation value, or selects a mean value of the two noise variance estimation values. A filter coefficient calculator calculates a filter coefficient based on a first selected noise variance value. An extrinsic LLR calculator calculates an extrinsic LLR by using a second selected noise variance value selected by the second noise variance selector.

9 Claims, 1 Drawing Sheet

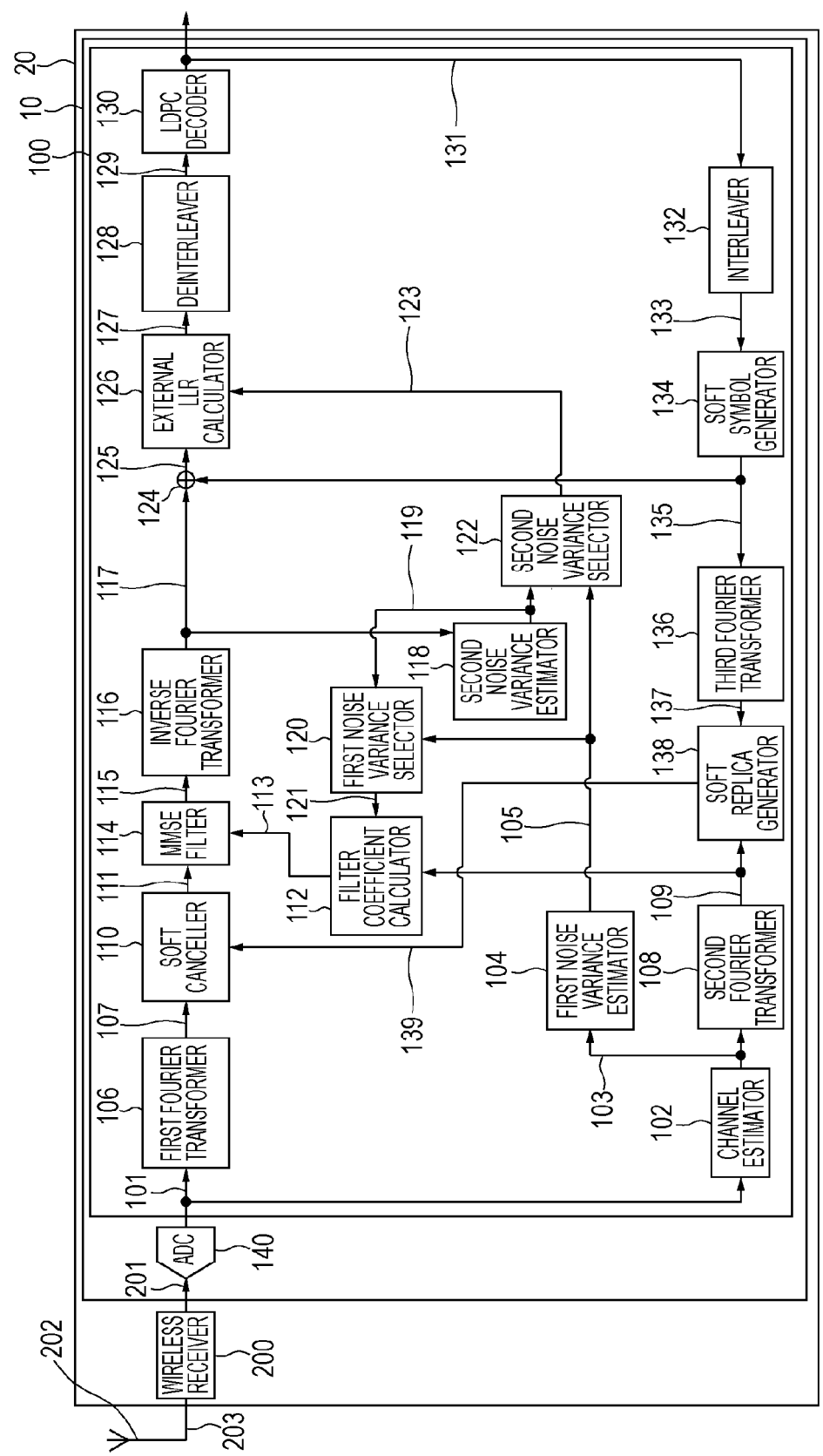

TURBO EQUALIZER AND WIRELESS RECEIVING APPARATUS

BACKGROUND

1. Technical Field

The present disclosure relates to a turbo equalizer that uses a noise variance estimation value and a wireless receiving apparatus that includes the turbo equalizer.

2. Description of the Related Art

A turbo equalizer has a strong equalizing capability for multipath inter-symbol interference (ISI). A known type of turbo equalizer that can reduce an operation amount of ISI equalization is a turbo equalizer that has a frequency domain soft canceller followed by minimum mean squared error (MMSE) filter. In combination with the sum-product decoding method, a low density parity check (LDPC) code has an excellent correcting capacity that approaches the Shannon limit. The sum-product decoding method calculates the likelihood of all data bits in a decoding process, and does not require re-encoding in a process of generating soft replicas in repetitive processing of turbo equalization. Therefore, the LDPC code can be said to be an error correcting code suitable for the turbo equalizer.

In the turbo equalizer that has the frequency domain soft canceller followed by MMSE filter and uses the LDPC code, a noise variance (see Japanese Unexamined Patent Application Publication No. 2006-54900) of a received signal is used to calculate a coefficient for the MMSE filter and calculate a logarithm of likelihood ratio (LLR) to be given to an LDPC decoder. The accuracy of estimating a noise variance affects reception performance.

SUMMARY

However, in the related art described in Japanese Unexamined Patent Application Publication No. 2006-54900, because a noise variance is estimated based on power, it is difficult to perform estimation also in consideration of phase noise of a received signal. Therefore, in the related art, the accuracy of estimating a noise variance is low and equalization performance of a turbo equalizer is deteriorated under an environment in which phase noise of a received signal is relatively large.

One non-limiting and exemplary embodiment provides a turbo equalizer and a wireless receiving apparatus that can suppress deterioration of equalization performance even under an environment in which phase noise of a received signal is relatively large.

In one general aspect, the techniques disclosed here feature a turbo equalizer that includes: a first noise variance estimator that calculates a first noise variance estimation value based on a channel estimation value of a received signal; a minimum mean squared error (MMSE) filter that performs equalization processing on a residual interference component that is obtained by subtracting an interference component and a desired signal component from the received signal; a second noise variance estimator that calculates a second noise variance estimation value by using the equalized residual interference component that is output from the MMSE filter; a first noise variance selector that selects either one of the first noise variance estimation value or the second noise variance estimation value, or selects a mean value of the first noise variance estimation value and the second noise variance estimation value, based on a first judgment criterion, and outputs the selected value as a first selected noise variance value; a second noise variance selector that selects either one of the first noise variance estimation value or the second noise variance estimation value, or selects the mean value of the first noise variance estimation value and the second noise variance estimation value, based on a second judgment criterion, and outputs the selected value as a second selected noise variance value; a filter coefficient calculator that calculates a filter coefficient for the MMSE filter by using the first selected noise variance value; and a logarithmic likelihood ratio calculator that calculates a logarithm of likelihood ratio to be used for LDPC decoding by using the second selected noise variance value.

These general and specific aspects may be implemented using a device, a system, a method, and a computer program, and any combination of devices, systems, methods, and computer programs.

According to the present disclosure, one of two types of noise variances that differ in character is appropriately selected and the selected noise variance is used to calculate a coefficient for the MMSE filter and calculate an LLR. Therefore, it is possible to suppress deterioration of equalization performance of the turbo equalizer even under an environment in which phase noise of a received signal is relatively large.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

The FIGURE is a block diagram illustrating a configuration of a wireless receiving apparatus that includes a turbo equalizer according to an embodiment of the present disclosure.

DETAILED DESCRIPTION

An embodiment of the present disclosure will now be described in detail with reference to the drawing as appropriate.

The FIGURE is a block diagram illustrating a configuration of a wireless receiving apparatus that includes a turbo equalizer according to an embodiment of the present disclosure. As illustrated in the FIGURE, a wireless receiving apparatus 20 includes a wireless receiver 200, an antenna 202, and a baseband unit 10.

The wireless receiver 200 performs amplification processing, frequency conversion processing, and so on for a received wireless signal 203 received by the antenna 202, and outputs an analog received signal 201 that is obtained to an ADC 140 included in the baseband unit 10.

The baseband unit 10 includes the ADC 140 and a turbo equalizer 100. The ADC 140 performs analog-to-digital conversion processing for the analog received signal 201, and outputs a digital received signal 101 to a channel estimator 102 and a first Fourier transformer 106 included in the turbo equalizer 100.

The turbo equalizer 100 performs turbo equalization processing for the digital received signal (also simply referred to as "received signal" below) 101. The turbo equalizer 100 is mainly configured with the channel estimator 102, a first noise variance estimator 104, the first Fourier transformer 106, a second Fourier transformer 108, a soft canceller 110, a filter coefficient calculator 112, an MMSE filter 114, an inverse Fourier transformer 116, a second noise variance estimator 118, a first noise variance selector 120, a second noise variance selector 122, an adder 124, an extrinsic LLR calculator 126, a deinterleaver 128, an LDPC decoder 130, an interleaver 132, a soft symbol generator 134, a third Fourier transformer 136, and a soft replica generator 138.

The channel estimator 102 performs channel estimation using a known signal portion included in the received signal 101. Specifically, the channel estimator 102 performs channel estimation with a correlation operation of a channel estimation field in the received signal 101 and a reference channel estimation field (reference known signal sequence) prepared in advance. The channel estimation field is configured with a known signal sequence in a preamble included in the received signal 101.

The channel estimator 102 outputs, to the first noise variance estimator 104 and the second Fourier transformer 108, a correlation characteristic obtained by channel estimation as an estimated channel value 103. Because the channel estimator 102 performs channel estimation once for one received frame, the estimated channel value 103 does not change during reception of a single received frame.

The first noise variance estimator 104 calculates a first noise variance estimation value 105 based on power of a delay path detected from the estimated channel value 103 and power of a known signal sequence (pilot symbols) of the received signal 101, using formula (1) below. Similarly to the estimated channel value 103, the first noise variance estimation value 105 does not change during reception of a single received frame.

$$\hat{\sigma}_1^2 \approx \frac{K}{K-1}\left(\frac{1}{K}\sum_k |y_l(k)|^2 - |\hat{h}_l|^2\right) \quad (1)$$

In formula (1):
$\hat{\sigma}_1^2$
The above is the first noise variance estimation value 105, K is the number of pilot symbols to be used for estimation, and $y_l$ is power of a pilot symbol that is inverse-diffused for the l-th individual fading path.
$\hat{h}_l$
The above is power of the l-th delay path.

The first noise variance estimator 104 outputs the first noise variance estimation value 105 to the first noise variance selector 120 and the second noise variance selector 122.

The first Fourier transformer 106 converts the received signal 101 from a time domain signal to a frequency domain signal by performing Fourier transformation processing for the received signal 101. Then, the first Fourier transformer 106 outputs, to the soft canceller 110, a frequency domain received signal 107 obtained as a result of Fourier transformation.

The second Fourier transformer 108 converts the estimated channel value 103 from a time domain signal to a frequency domain signal by performing Fourier transformation processing for the estimated channel value 103. Then, the second Fourier transformer 108 outputs, to the filter coefficient calculator 112 and the soft replica generator 138, a frequency transfer function 109 obtained as a result of Fourier transformation.

The soft canceller 110 cancels an interference component from the frequency domain received signal 107 by subtracting (soft canceling) a soft replica 139 from the frequency domain received signal 107. At this time, in addition to the interference component, a desired signal component is also canceled. However, the desired signal component is reproduced in the adder 124.

The soft canceller 110 outputs a residual interference component 111 to the MMSE filter 114. When soft cancellation is ideally performed, that is, the soft replica 139 reproduces the interference component and the desired signal component and the interference component and the desired signal component are subtracted from the frequency domain received signal 107, a noise component such as thermal noise or phase noise remains in the residual interference component 111.

The filter coefficient calculator 112 calculates a filter coefficient 113 based on the frequency transfer function 109 and a first selected noise variance value 121, using formula (2) below, and outputs the filter coefficient 113 to the MMSE filter 114.

$$C = \frac{\Xi^H}{\Xi \Delta \Xi^H + \rho_1^2 I} \quad (2)$$

In formula (2), C is the filter coefficient 113.
$\rho_1^2$
The above is the first selected noise variance value 121.
$\Xi$
The above is the frequency transfer function 109, $\Delta$ is interference component power, I is an identity matrix, and $^H$ is a complex conjugate transposition.

The MMSE filter 114 performs MMSE-standard frequency domain equalization processing for the residual interference component 111, using the filter coefficient 113. Then, the MMSE filter 114 outputs, to the inverse Fourier transformer 116, an equalized residual interference component 115 obtained by frequency domain equalization processing.

The inverse Fourier transformer 116 converts the equalized residual interference component 115 from a frequency domain signal to a time domain signal by performing inverse Fourier transformation for the equalized residual interference component 115. Then, the inverse Fourier transformer 116 outputs, to the second noise variance estimator 118 and the adder 124, an equalized residual interference component 117 of the time domain obtained as a result of inverse Fourier transformation.

The second noise variance estimator 118 calculates a second noise variance estimation value 119, using the equalized residual interference component 117 of the time domain.

In the first round of equalization processing of repetitive processing of turbo equalization, because the soft replica 139 is not provided and soft cancellation is not performed in the soft canceller 110, a desired signal component is included in the equalized residual interference component 117 of the time domain. Therefore, in the first round, the second noise variance estimator 118 calculates the second noise variance estimation value 119, using formula (3) below.

$$\sigma_2^2 = \frac{1}{m}\sum_i^m (\overline{e} - \{x_i - x_i'\})^2 \quad (3)$$

In formula (3):

$\sigma_2^2$

The above is the second noise variance estimation value 119, $x_i$ (i=1, . . . , m) is the equalized residual interference component 117 of the time domain, and $x'_i$ is a tentative determination point of $x_i$.

$\bar{e}$

The above is an arithmetical mean of $x'_i - x_i$.

On the other hand, in the second and subsequent rounds of equalization processing of repetitive processing of turbo equalization, the soft replica 139 has been generated and soft cancellation is performed in the soft canceller 110. In this case, as described above, ideally an interference component and a desired signal component are not included and there is a noise component in the equalized residual interference component 117 of the time domain. Therefore, in the second and subsequent rounds, the second noise variance estimator 118 calculates the second noise variance estimation value 119, using formula (4).

$$\sigma_2^2 = \frac{1}{m}\sum_{i}^{m}(\bar{x} - x_i)^2 \quad (4)$$

In formula (4):

$\sigma_2^2$

The above is the second noise variance estimation value 119 and $x_i$ (i=1, . . . , m) is the equalized residual interference component 117 of the time domain.

$\bar{x}$

The above is an arithmetical mean of $x_i$.

The second noise variance estimator 118 calculates a noise variance on an IQ plane, and can therefore estimate a noise variance also including phase noise. Further, the second noise variance estimator 118 estimates a noise variance in units of Fourier transformation processing in the first Fourier transformer 106, and can therefore estimate a noise variance while following a temporal variation of phase noise. Moreover, the second noise variance estimator 118 estimates a noise variance for each round of repetitive processing by the turbo equalizer, and can therefore estimate a noise variance while following an improvement in the equalized residual interference component 117 of the time domain through repetitive processing by the turbo equalizer.

The second noise variance estimator 118 outputs, to the first noise variance selector 120 and the second noise variance selector 122, the second noise variance estimation value 119 that has been estimated.

The first noise variance selector 120 selects either one of the first noise variance estimation value 105 or the second noise variance estimation value 119, or selects a mean value of the first noise variance estimation value 105 and the second noise variance estimation value 119, based on a first judgment criterion. Then, the first noise variance selector 120 outputs, to the filter coefficient calculator 112, a first selected noise variance value 121, which is a selection result. An example of selection based on the first judgment criterion will now be described.

In the first round of equalization processing in the MMSE filter 114 in repetitive processing of turbo equalization, the first noise variance selector 120 selects the first noise variance estimation value 105 because the second noise variance estimation value 119 has not been estimated.

On the other hand, in the second and subsequent rounds of equalization processing in the MMSE filter 114, the first noise variance selector 120 performs selection processing based on various judgment criteria because both the first noise variance estimation value 105 and the second noise variance estimation value 119 are provided.

In an example of the first judgment criterion, the first noise variance selector 120 performs selection processing based on a magnitude relationship between the first noise variance estimation value 105 and the second noise variance estimation value 119. The magnitude relationship can be decided by, for example, the estimation tendency of the first noise variance estimator 104.

That is, when it is known that the first noise variance estimation 105 is estimated as a smaller value with respect to a theoretical value, the first noise variance selector 120 selects either the first noise variance estimation value 105 or the second noise variance estimation value 119, whichever is larger. In contrast, when it is known that the first noise variance estimation value 105 is estimated as a larger value with respect to the theoretical value, the first noise variance selector 120 selects either the first noise variance estimation value 105 or the second noise variance estimation value 119, whichever is smaller.

Alternatively, in another example of the first judgment criterion, the first noise variance selector 120 selects a mean value of the first noise variance estimation value 105 and the second noise variance estimation value 119.

The second noise variance selector 122 selects either the first noise variance estimation value 105 or the second noise variance estimation value 119, or the mean value of the first noise variance estimation value 105 and the second noise variance estimation value 119, based on a second judgment criterion. Then, the second noise variance selector 122 outputs, to the extrinsic LLR calculator 126, a second selected noise variance value 123, which is a selection result. An example of selection based on the second judgment criterion will now be described.

In an example of the second judgment criterion, in repetitive processing of turbo equalization, the second noise variance selector 122 selects the first noise variance estimation value 105 before the second noise variance estimation value 119 is input and if the first round of an operation by the extrinsic LLR calculator 126 has already been started.

On the other hand, the second noise variance selector 122 can select either the first noise variance estimation value 105 and the second noise variance estimation value 119 based on the magnitude relationship between the first noise variance estimation value 105 and the second noise variance estimation value 119 before the second noise variance estimation value 119 is input and if the first round of an operation by the extrinsic LLR calculator 126 has not yet been started or when the second and subsequent rounds of an operation by the extrinsic LLR calculator 126 are performed. The magnitude relationship can be decided by, for example, the estimation tendency of the first noise variance estimator 104.

That is, when it is known that the first noise variance estimation value 105 is estimated as a smaller value with respect to the theoretical value, the second noise variance selector 122 selects either the first noise variance estimation value 105 or the second noise variance estimation value 119, whichever is larger. In contrast, when it is known that the first noise variance estimation value 105 is estimated as a larger value with respect to the theoretical value, the second noise variance selector 122 selects either the first noise variance estimation value 105 or the second noise variance estimation value 119, whichever is smaller.

Alternatively, in another example of the second judgment criterion, the second noise variance selector 122 selects a mean value of the first variance estimation value 105 and the second noise variance estimation value 119.

The adder 124 reproduces the desired signal component by adding a soft symbol 135 to the equalized residual interference component 117 of the time domain, and outputs a reproduced signal 125 to the extrinsic LLR calculator 126.

The extrinsic LLR calculator 126 calculates an extrinsic logarithm of likelihood ratio (LLR) 127 based on the second selected noise variance value 123 and the reproduced signal 125, using formula (5) below, and outputs the extrinsic LLR 127 to the deinterleaver 128.

$$\Lambda_1^e = \frac{2y}{\rho_2^2} \qquad (5)$$

In formula (5):
$\Lambda_1^e$
The above is the extrinsic LLR 127.
$\rho_2^2$
The above is the second selected noise variance value 123 and y is the reproduced signal 125.

The deinterleaver 128 performs deinterleaving processing for the extrinsic LLR 127, and outputs a resultant first priori LLR 129 to the LDPC decoder 130.

The LDPC decoder 130 performs decoding processing for the first priori LLR 129 using, for example, the sum-product decoding method, and outputs a posteriori LLR 131 to the interleaver 132.

The interleaver 132 performs interleaving processing for the posteriori LLR 131, and outputs a resultant second priori LLR 133 to the soft symbol generator 134.

The soft symbol generator 134 generates the soft symbol 135 using, for example, formula (6) below, and outputs the soft symbol 135 to the adder 124 and the third Fourier transformer 136.

$$S = \tanh\left(\frac{\Lambda_2^p}{2}\right) \qquad (6)$$

In formula (6), S is the soft symbol 135.
$\Lambda_2^p$
The above is the second priori LLR 133.

The third Fourier transformer 136 converts the soft symbol 135 from a time domain signal to a frequency domain by performing Fourier transformation for the soft symbol 135. Then, the third Fourier transformer 136 outputs, to the soft replica generator 138, a frequency domain soft symbol 137 obtained as a result of Fourier transformation.

The soft replica generator 138 generates the soft replica 139 using, for example, formula (7) below, and outputs the soft replica 139 to the soft canceller 110.

$$R = \Xi \times S \qquad (7)$$

In formula (7), R is the soft replica 139.
$\Xi$
The above is the frequency transfer function 109 and S is the soft symbol 135.

The LDPC code has an interleaver in the code structure, and therefore a wireless sending apparatus (not shown) may not include the interleaver. In this case, the deinterleaver 128 and the interleaver 132 are deleted from the FIGURE.

Instead of the first priori LLR 129, the extrinsic LLR 127 is output to the LDPC decoder 130, and instead of the second priori LLR 133, the posteriori LLR 131 is output to the soft symbol generator 134.

As described above, in the present embodiment, two types of noise variance estimation values are calculated. The first noise variance estimation value is estimated based on power of a correlation characteristic of a known signal sequence. The second noise variance estimation value is estimated based on a variance of a signal equalized by the MMSE filter. In the SC/MMSE turbo equalizer of a frequency domain, if soft cancellation in the soft canceller is ideally performed, an interference component and a desired signal component is removed from a received signal, and therefore an MMSE filter output is a noise component such as thermal noise or phase noise. Accordingly, when a variance of the MMSE filter output is calculated, a noise variance can be estimated accurately. Actually, however, because soft cancellation is not performed ideally, the accuracy of estimating the second noise variance is not necessary higher than the accuracy of estimating the first noise variance.

In the present embodiment, either value selected from the noise variance estimation values, or a mean value of the two noise variance estimation values, is used to calculate a coefficient for the MMSE filter and calculate an LLR for LDPC decoding.

Thus, according to the present embodiment, it is possible to suppress deterioration of equalization performance of a turbo equalizer under an environment in which phase noise of a received signal is relatively large, for example, when a low-cost local oscillator is used or a high frequency such as a terahertz band is used.

Although various embodiments have been described above with reference to the drawing, it is obvious that the present disclosure is not limited to such examples. It is apparent that those skilled in the art would be able to conceive various examples of changes or modifications within the scope indicated in the claims, and it should be appreciated that these examples are also included in the technical scope of the present disclosure.

In the above embodiment, the present disclosure has been described with an example in which a configuration is made with hardware. However, the present disclosure may be implemented by software in collaboration with the hardware.

The functional blocks used to describe the present embodiment are typically implemented as LSI chips, which are integrated circuits. Each individual functional block may be contained on a single LSI chip, or some or all functional blocks may be contained on a single LSI chip. The integrated circuit technique is LSI here, but may be referred to as IC, system LSI, super LSI, or ultra LSI depending on a difference in a degree of integration.

The integrated circuit technique is not limited to LSI, and the functional blocks may be implemented using dedicated circuits or general-purpose processors. Field programmable gate arrays (FPGAs) that are programmable after the manufacture of LSI chips or reconfigurable processors with which the connection and setting of circuit cells inside the LSI chips are reconfigurable may be used.

In addition, if an integrated circuit technology that replaces LSI emerges with the advance of the semiconductor technology or with the advent of another derivative technology, it should be appreciated that the functional blocks may be integrated using that technology. There is a possibility of, for example, applying the biotechnology.

The present disclosure is suitable for a turbo equalizer that uses an noise variance estimation value and a wireless receiving apparatus that includes the turbo equalizer.

What is claimed is:

1. A turbo equalizer comprising:
   a first noise variance estimator that calculates a first noise variance estimation value based on a channel estimation value of a received signal;
   a minimum mean squared error (MMSE) filter that performs equalization processing on a residual interference component that is obtained by subtracting an interference component and a desired signal component from the received signal;
   a second noise variance estimator that calculates a second noise variance estimation value by using the equalized residual interference component that is output from the MMSE filter;
   a first noise variance selector that selects either one of the first noise variance estimation value or the second noise variance estimation value, or selects a mean value of the first noise variance estimation value and the second noise variance estimation value, based on a first judgment criterion that is different between a first round and a second or subsequent round of repetitive processing of turbo equalization, and outputs the selected value as a first selected noise variance value;
   a second noise variance selector that selects either one of the first noise variance estimation value or the second noise variance estimation value, or selects the mean value of the first noise variance estimation value and the second noise variance estimation value, based on a second judgment criterion that is different between the first round and the second or subsequent round of repetitive processing of the turbo equalization, and outputs the selected value as a second selected noise variance value;
   a filter coefficient calculator that calculates a filter coefficient for the MMSE filter by using the first selected noise variance value; and
   a logarithmic likelihood ratio calculator that calculates a logarithm of likelihood ratio to be used for low density parity check (LDPC) decoding by using the second selected noise variance value.

2. The turbo equalizer according to claim 1,
   wherein when the turbo equalization processing is the first round of repetitive processing of the turbo equalization, the first noise variance selector selects the first noise variance estimation value, and outputs, to the filter coefficient calculator, the selected value as the first selected noise variance value.

3. The turbo equalizer according to claim 1,
   wherein when the turbo equalization processing is the second round of repetitive processing of the turbo equalization, the first noise variance selector selects either one of the first noise variance estimation value or the second noise variance estimation value based on a magnitude relationship between the first noise variance estimation value and the second noise variance estimation value, and outputs, to the filter coefficient calculator, the selected value as the first selected noise variance value.

4. The turbo equalizer according to claim 1,
   wherein when the turbo equalization processing is the second or subsequent round of repetitive processing of the turbo equalization, the first noise variance selector outputs, to the filter coefficient calculator, the mean value of the first noise variance estimation value and the second noise variance estimation value as the first selected noise variance value.

5. The turbo equalizer according to claim 1, wherein in the repetitive processing of the turbo equalization, before the second noise variance estimation value is input to the second noise variance selector and after the first round of the calculation of a logarithm of likelihood ratio is started in the logarithmic likelihood ratio calculator, the second noise variance selector selects the first noise variance estimation value, and outputs, to the logarithmic likelihood ratio calculator, the selected value as the second selected noise variance value.

6. The turbo equalizer according to claim 1, wherein in the repetitive processing of the turbo equalization, before the second noise variance estimation value is input to the second noise variance selector and before the first round of the calculation of a logarithm of likelihood ratio is started or when the second and subsequent rounds of a calculation of a logarithm of likelihood ratio is performed in the logarithmic likelihood ratio calculator, the second noise variance selector selects either one of the first noise variance estimation value or the second estimated noise variance value based on a magnitude relationship between the first noise variance estimation value and the second noise variance estimation value, and outputs, to the logarithmic likelihood ratio calculator, the selected value as the second selected noise variance value.

7. The turbo equalizer according to claim 1, wherein in the repetitive processing of the turbo equalization, before the second noise variance estimation value is input to the second noise variance selector and before the first round of the calculation of a logarithm of likelihood ratio is started or when the second or subsequent round of a calculation of a logarithm of likelihood ratio is performed in the logarithmic likelihood ratio calculator, the second noise variance selector outputs, to the logarithmic likelihood ratio calculator, the mean value of the first noise variance estimation value and the second noise variance estimation value as the second selected noise variance value.

8. The turbo equalizer according to claim 1, further comprising:
   a channel estimator that calculates the channel estimation value by calculating a correlation of a known signal sequence included in the received signal and a known reference signal sequence.

9. A wireless receiving apparatus comprising:
   an analog-to-digital convertor that performs analog-to-digital conversion on an analog received signal and outputs a digital received signal; and
   a turbo equalizer that performs turbo equalization processing on the digital received signal, the turbo equalizer including:
      a first noise variance estimator that calculates a first noise variance estimation value based on a channel estimation value of the digital received signal;
      a minimum mean squared error (MMSE) filter that performs equalization processing on a residual interference component that is obtained by subtracting an interference component and a desired signal component from the digital received signal;
      a second noise variance estimator that calculates a second noise variance estimation value by using the equalized residual interference component that is output from the MMSE filter;
      a first noise variance selector that selects either one of the first noise variance estimation value or the second noise variance estimation value, or selects a mean value of the first noise variance estimation value and the second noise variance estimation value, based on a first judgment criterion that is different between a first round and a second or subsequent round of repetitive processing of turbo equalization, and outputs the selected value as a first selected noise variance value;

a second noise variance selector that selects either one of the first noise variance estimation value or the second noise variance estimation value, or selects the mean value of the first noise variance estimation value and the second noise variance estimation value, based on a second judgment criterion that is different between the first round and the second or subsequent round of repetitive processing of the turbo equalization, and outputs the selected value as a second selected noise variance value;

a filter coefficient calculator that calculates a filter coefficient for the MMSE filter using the first selected noise variance value; and a logarithmic likelihood ratio calculator that calculates a logarithm of likelihood ratio to be used for low density parity check (LDPC) decoding by using the second selected noise variance value.

* * * * *